(12) United States Patent
Motomatsu et al.

(10) Patent No.: US 11,441,225 B2
(45) Date of Patent: Sep. 13, 2022

(54) SUBSTRATE LIQUID PROCESSING APPARATUS

(71) Applicant: Tokyo Electron Limited, Tokyo (JP)

(72) Inventors: Kazuki Motomatsu, Koshi (JP); Satoshi Kaneko, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 60 days.

(21) Appl. No.: 16/768,245

(22) PCT Filed: Nov. 27, 2018

(86) PCT No.: PCT/JP2018/043496
§ 371 (c)(1),
(2) Date: May 29, 2020

(87) PCT Pub. No.: WO2019/107331
PCT Pub. Date: Jun. 6, 2019

(65) Prior Publication Data
US 2021/0172066 A1  Jun. 10, 2021

(30) Foreign Application Priority Data

Dec. 1, 2017 (JP) .............................. JP2017-231745
Oct. 30, 2018 (JP) .............................. JP2018-203794

(51) Int. Cl.
*C23C 18/16* (2006.01)
*B05B 13/02* (2006.01)
(Continued)

(52) U.S. Cl.
CPC ............ *C23C 18/168* (2013.01); *B05B 13/02* (2013.01); *B05C 5/001* (2013.01); *B05C 13/00* (2013.01);
(Continued)

(58) Field of Classification Search
USPC ..... 118/52, 612, 56, 319, 320, 666, 667, 58, 118/59
See application file for complete search history.

(56) References Cited

U.S. PATENT DOCUMENTS 6,858,084 B2 * 2/2005 Inoue ................ H01L 21/76843
118/666
7,540,923 B2 * 6/2009 Takagi .............. H01J 37/32935
118/667

(Continued)

FOREIGN PATENT DOCUMENTS

JP     S61-28617 A    2/1986
JP     H09-017761 A   1/1997
(Continued)

OTHER PUBLICATIONS

Abstract CN202014382U and Drawing (Year: 2011).*
International Search Report for PCT/JP2018/043496 dated Feb. 26, 2019.

*Primary Examiner* — Yewebdar T Tadesse
(74) *Attorney, Agent, or Firm* — Pearne & Gordon LLP

(57) ABSTRACT

A substrate liquid processing apparatus configured to perform a heating control over a processing liquid on a substrate with high accuracy in a unit of zones is provided. The substrate liquid processing apparatus includes a substrate holder configured to hold the substrate; a processing liquid supply configured to supply the processing liquid onto a processing surface of the substrate; and a heating unit configured to heat the processing liquid on the processing surface. The heating unit includes a heater, and a first sheet-shaped body and a second sheet-shaped body which are disposed to face the heater therebetween. The heater includes multiple heating elements provided in multiple heating zones of the heating unit.

9 Claims, 6 Drawing Sheets

(51) Int. Cl.
     *B05C 5/00*           (2006.01)
     *C23C 18/31*        (2006.01)
     *B05C 13/00*       (2006.01)

(52) U.S. Cl.
     CPC ...... *C23C 18/1628* (2013.01); *C23C 18/1642* (2013.01); *C23C 18/31* (2013.01)

(56) References Cited

U.S. PATENT DOCUMENTS

| | | | |
|---|---|---|---|
| 7,661,386 B2* | 2/2010 | Kasai | C23C 16/45565 118/666 |
| 2017/0121822 A1* | 5/2017 | Mizutani | C23C 18/168 |

FOREIGN PATENT DOCUMENTS

| | | |
|---|---|---|
| JP | H10-249891 A | 9/1998 |
| JP | 2002-129344 A | 5/2002 |
| JP | 2004-107747 A | 4/2004 |
| JP | 2012-136783 A | 7/2012 |
| JP | 2017-082290 A | 5/2017 |
| JP | 2018-003097 A | 1/2018 |

* cited by examiner

SUBSTRATE LIQUID PROCESSING APPARATUS

CROSS-REFERENCE TO RELATED APPLICATION

This Application is a U.S. national phase application under 35 U.S.C. § 371 of PCT Application No. PCT/JP2018/043496 filed on Nov. 27, 2018, which claims the benefit of Japanese Patent Application Nos. 2017-231745 and 2018-203794 filed on Dec. 1, 2017 and Oct. 30, 2018, respectively, the entire disclosures of which are incorporated herein by reference.

TECHNICAL FIELD

The various aspects and embodiments described herein pertain generally to a substrate liquid processing apparatus.

BACKGROUND

In general, there is known a substrate liquid processing apparatus configured to perform a liquid processing on a substrate (wafer) by using a processing liquid such as a cleaning liquid for performing a cleaning process on the substrate or a plating liquid for performing a plating processing on the substrate (see, for example, Patent Documents 1 to 3). In this substrate liquid processing apparatus, a heated processing liquid may be used. To perform such a liquid processing appropriately, the processing liquid on the substrate needs to have a required temperature adequate for the liquid processing. Particularly, in order to perform the liquid processing uniformly on an entire processing surface of the substrate, the processing liquid needs to have a uniform temperature across the entire processing surface.

For various reasons, however, the processing liquid may not necessarily have the uniform temperature on the entire processing surface. By way of example, the processing liquid at a peripheral portion of the substrate tends to easily decrease as compared to the processing liquid at a central portion of the substrate.

To resolve such a non-uniform temperature distribution of the processing liquid on the substrate, there may be considered a method of splitting the processing surface into a plurality of processing zones and splitting a heating unit such as a heater to have a plurality of heating zones. In this method, the heating zones are respectively allotted to the corresponding processing zones, and the processing liquid is heated by an optimum heat amount for each processing zone. In this method, however, it is difficult to perform a heating control over the processing liquid appropriately in the unit of the processing zones. Particularly, since heat generated from the heating unit is conducted between neighboring heating zones, a clear difference or a gradient may not be assigned to the heat amount actually applied to the processing liquid between the neighboring heating zones.

PRIOR ART DOCUMENT

Patent Document 1: Japanese Patent Laid-open Publication No. H09-017761
Patent Document 2: Japanese Patent Laid-open Publication No. 2004-107747
Patent Document 3: Japanese Patent Laid-open Publication No. 2012-136783

DISCLOSURE OF THE INVENTION

Problems to be Solved by the Invention

Means for Solving the Problems

In one exemplary embodiment, there is provided a substrate liquid processing apparatus configured to perform a liquid processing on a processing surface of a substrate with a processing liquid. The substrate liquid processing apparatus includes a substrate holder configured to hold the substrate; a processing liquid supply configured to supply the processing liquid onto the processing surface of the substrate held by the substrate holder; and a heating unit configured to heat the processing liquid on the processing surface. The heating unit includes a heater, and a first sheet-shaped body and a second sheet-shaped body which are disposed to face the heater therebetween. The heater includes multiple heating elements provided in multiple heating zones of the heating unit. At least one of the first sheet-shaped body and the second sheet-shaped body has a groove, and the groove is provided at a region corresponding to a boundary between neighboring heating zones among the multiple heating zones.

DETAILED DESCRIPTION

Hereinafter, an exemplary embodiment of the present disclosure will be described with reference to accompanying drawings which form a part hereof.

Figure 1:
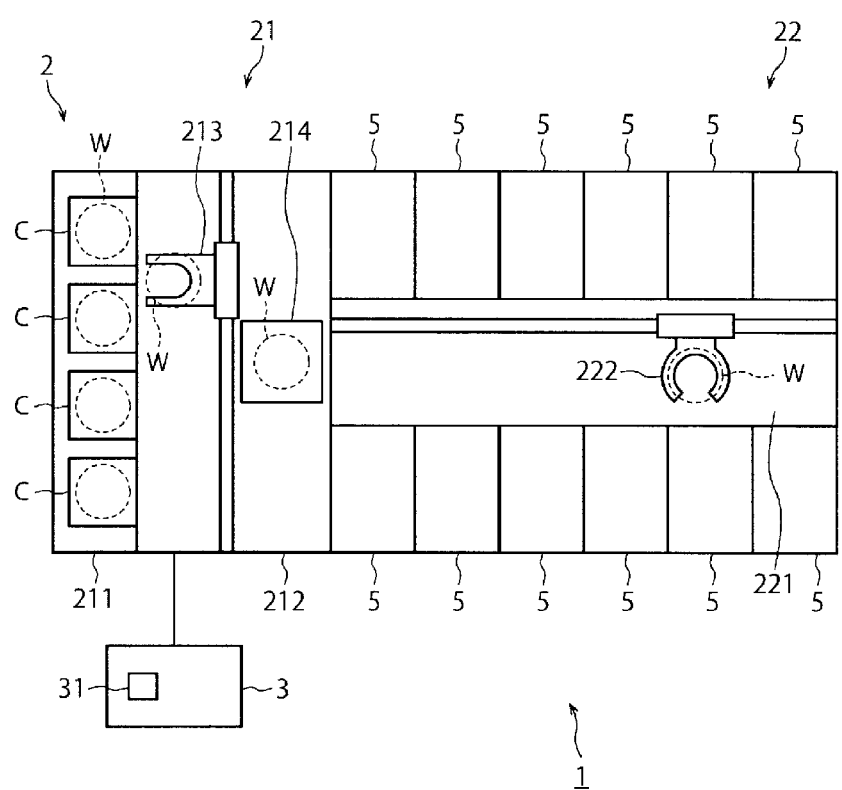
FIG. 1 is a schematic plan view illustrating a configuration of a plating apparatus.

First, referring to FIG. 1, a configuration of a substrate liquid processing apparatus according to an exemplary embodiment will be explained. FIG. 1 is a schematic diagram illustrating a configuration of a plating apparatus as an example of the substrate liquid processing apparatus according to the exemplary embodiment. Here, the plating apparatus is an apparatus configured to perform a plating processing (a liquid processing) on a substrate W by supplying a plating liquid L1 (processing liquid) onto the substrate W.

As depicted in FIG. 1, a plating apparatus 1 according to the present exemplary embodiment is equipped with a plating unit 2 and a controller 3 configured to control an operation of the plating unit 2.

The plating unit 2 is configured to perform various processings on the substrate W (wafer). The various processings performed by the plating unit 2 will be described later.

The controller 3 is implemented by, for example, a computer, and includes an operation controller and a storage. The operation controller is implemented by, by way of example, a CPU (Central Processing Unit) and is configured to control an operation of the plating unit 2 by reading and executing programs stored in the storage. The storage may be implemented by a memory device such as, but not limited to, a RAM (Random Access Memory), a ROM (Read Only Memory), or a hard disk, and stores therein programs for controlling the various processings performed in the plating unit 2. The programs may be recorded in a computer-readable recording medium 31, or may be installed from the recording medium 31 to the storage. The computer-readable recording medium 31 may be, by way non-limiting example, a hard disk (HD), a flexible disk (FD), a compact disk (CD), a magnet optical disk (MO), or a memory card. Stored in the recording medium 31 is a program which, when executed by a computer for controlling the operation of the plating apparatus 1, allows the computer to control the plating apparatus 1 to perform a plating method to be described later.

Referring to FIG. 1, a configuration of the plating unit 2 will be elaborated. FIG. 1 is a schematic plan view illustrating the configuration of the plating unit 2.

The plating unit 2 includes a carry-in/out station 21 and a processing station 22 which is provided adjacent to the carry-in/out station 21.

The carry-in/out station 21 is equipped with a placing section 211 and a transfer section 212 which is provided adjacent to the placing section 211.

In the placing section 211, transfer containers (hereinafter, referred to as "carriers C") for accommodating therein a plurality of substrates W horizontally are placed.

The transfer section 212 is equipped with a transfer device 213 and a delivery unit 214. The transfer device 213 is provided with a holding mechanism configured to hold a substrate W and is configured to be movable horizontally and vertically and pivotable around a vertical axis.

The processing station 22 includes plating devices 5. In the present exemplary embodiment, the number of the plating devices 5 belonging to the processing station 22 is two or more. However, only one plating device 5 may be provided. The plating devices 5 are arranged at both sides (both sides in a direction perpendicular to a moving direction of a transfer device 222 to be described below) of a transfer path 221 which extends in a preset direction.

The transfer device 222 is provided in the transfer path 221. The transfer device 222 is equipped with a holding mechanism configured to hold the substrate W and is configured to be movable horizontally and vertically and pivotable around a vertical axis.

In the plating unit 2, the transfer device 213 of the carry-in/out station 21 is configured to transfer the substrate W between the carrier C and the delivery unit 214. To elaborate, the transfer device 213 takes out the substrate W from the carrier C which is placed in the placing section 211, and places the substrate W in the delivery unit 214. Further, the transfer device 213 takes out the substrate W which is placed in the delivery unit 214 by the transfer device 222 of the processing station 22, and accommodates the substrate W back into the carrier C on the placing section 211.

In the plating unit 2, the transfer device 222 of the processing station 22 is configured to transfer the substrate W between the delivery unit 214 and the plating device 5 and between the plating device 5 and the delivery unit 214. To elaborate, the transfer device 222 takes out the substrate W which is placed in the delivery unit 214 and then carries the substrate W into the plating device 5. Further, the transfer device 222 takes out the substrate W from the plating device 5 and places the substrate W in the delivery unit 214.

Figure 2:
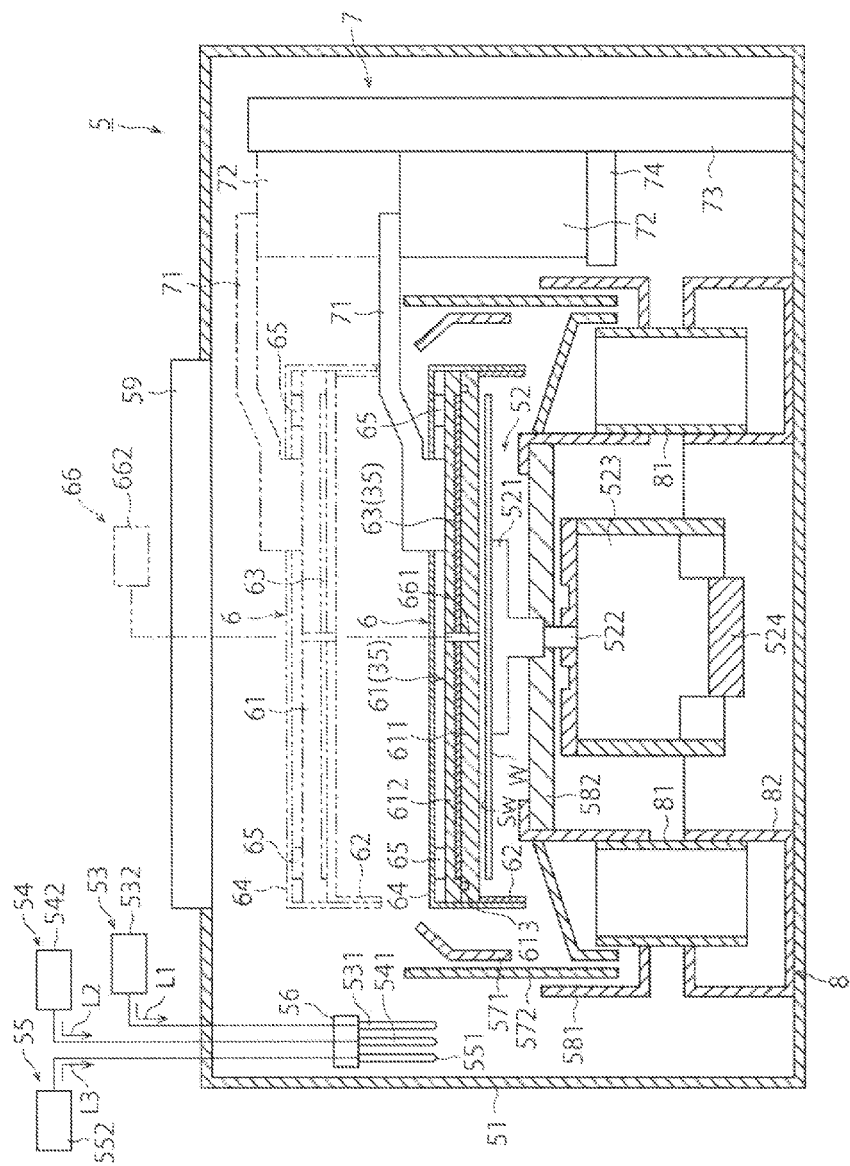
FIG. 2 is a cross sectional view illustrating a configuration of a plating device shown in FIG. 1.

Now, a configuration of the plating device 5 will be described with reference to FIG. 2. FIG. 2 is a schematic cross sectional view illustrating the configuration of the plating device 5.

The plating device 5 is configured to perform the liquid processing including an electroless plating processing. This plating device 5 includes a chamber 51; a substrate holder 52 provided within the chamber 51 and configured to hold the substrate W horizontally; and a plating liquid supply 53 (processing liquid supply) configured to supply the plating liquid L1 (processing liquid) onto a top surface (processing surface Sw) of the substrate W held by the substrate holder 52. In the present exemplary embodiment, the substrate holder 52 includes a chuck member 521 configured to vacuum-attract a bottom surface (rear surface) of the substrate W. This substrate holder 52 is of a so-called vacuum chuck type. However, the substrate holder 52 is not limited thereto and may be of a mechanism chuck type in which an edge portion of the substrate W is held by, for example, a chuck mechanism.

The substrate holder 52 is connected with a rotation motor 523 (rotational driving unit) via a rotation shaft 522. If the rotation motor 523 is driven, the substrate holder 52 is rotated along with the substrate W. The rotation motor 523 is supported on a base 524 which is fixed to the chamber 51.

The plating liquid supply 53 is equipped with a plating liquid nozzle 531 (processing liquid nozzle) configured to discharge (supply) the plating liquid L1 onto the substrate W held by the substrate holder 52; and a plating liquid source 532 configured to supply the plating liquid L1 to the plating liquid nozzle 531. The plating liquid source 532 is configured to supply the plating liquid L1 heated to or regulated to a preset temperature to the plating liquid nozzle 531. A temperature of the plating liquid L1 at the moment when it is discharged from the plating liquid nozzle 531 is in a range from, e.g., 55° C. to 75° C., more desirably, in a range from 60° C. to 70° C. The plating liquid nozzle 531 is held by a nozzle arm 56 and configured to be movable.

The plating liquid L1 is an autocatalytic (reduction) plating liquid for electroless plating. The plating liquid L1 contains a metal ion such as a cobalt (Co) ion, a nickel (Ni) ion, a tungsten (W) ion; a copper (Cu) ion, a palladium (Pd) ion, a gold (Au) ion or a ruthenium (Ru) ion, and a reducing agent such as hypophosphorous acid or dimethylaminebo-rane. The plating liquid L1 may further contain an additive or the like. A plating film (metal film) formed by the plating processing with the plating liquid L1 may be, by way of non-limiting example, CoWB, CoB, CoWP, CoWBP, NiWB, NiB, NiWP, NiWBP, or the like.

The plating device 5 according to the present exemplary embodiment is further equipped with, as other processing liquid supplies, a cleaning liquid supply 54 configured to supply a cleaning liquid L2 onto the top surface of the substrate W held by the substrate holder 52; and a rinse liquid supply 55 configured to supply a rinse liquid L3 onto the top surface of the substrate W.

The cleaning liquid supply 54 is equipped with a cleaning liquid nozzle 541 configured to discharge the cleaning liquid L2 onto the substrate W held by the substrate holder 52; and a cleaning liquid source 542 configured to supply the cleaning liquid L2 to the cleaning liquid nozzle 541. As an example of the cleaning liquid L2, an organic acid such as a formic acid, a malic acid, a succinic acid, a citric acid or a malonic acid, or a hydrofluoric acid (DHF) (aqueous solution of hydrogen fluoride) diluted to a concentration not causing corrosion of a plating target surface of the substrate W may be used. The cleaning liquid nozzle 541 is held by the nozzle arm 56 and configured to be movable along with the plating liquid nozzle 531.

The rinse liquid supply 55 is equipped with a rinse liquid nozzle 551 configured to discharge the rinse liquid L3 onto the substrate W held by the substrate holder 52; and a rinse liquid source 552 configured to supply the rinse liquid L3 to the rinse liquid nozzle 551. The rinse liquid nozzle 551 is held by the nozzle arm 56 and configured to be movable along with the plating liquid nozzle 531 and the cleaning liquid nozzle 541. As an example of the rinse liquid L3, pure water or the like may be used.

A non-illustrated nozzle moving device is connected to the nozzle arm 56 which holds the above-described plating liquid nozzle 531, the cleaning liquid nozzle 541 and the rinse liquid nozzle 551. This nozzle moving device is configured to move the nozzle arm 56 horizontally and vertically. To be more specific, the nozzle arm 56 is configured to be moved between a discharge position where the processing liquid (the plating liquid L1, the cleaning liquid L2 or the rinse liquid L3) is discharged onto the substrate W and a retreat position where the nozzle arm 56 is retreated from the discharge position by the nozzle moving device. Here, the discharge position is not particularly limited as long as the processing liquid can be supplied onto a certain position on the top surface of the substrate W. By way of example, appropriately, the discharge position may be set such that the processing liquid can be supplied onto the center of the substrate W. The discharge position of the nozzle arm 56 may be different when the plating liquid L1 is supplied onto the substrate W, when the cleaning liquid L2 is supplied onto the substrate W, and when the rinse liquid L3 is supplied onto the substrate W. The retreat position is a position far from the discharge position without being overlapped with the substrate W, when viewed from the top. When the nozzle arm 56 is placed at the retreat position, interference between this nozzle arm 56 and a cover body 6 being moved can be avoided.

A cup 571 is disposed around the substrate holder 52. The cup 571 has a ring shape when viewed from above. The cup 571 receives the processing liquid scattered from the substrate W when the substrate W is rotated, and guides the received processing liquid to a drain duct 581. An atmosphere blocking cover 572 is provided around the cup 571 to suppress diffusion of an atmosphere around the substrate W into the chamber 51. This atmosphere blocking cover 572 has a cylindrical shape vertically extending with an open top. The cover body 6 to be described later is configured to be inserted into the atmosphere blocking cover 572 from above.

A drain duct 581 is provided under the cup 571. This drain duct 581 is formed to have a ring shape when viewed from the top, and the processing liquid which has fallen down after being received by the cup 571 or the processing liquid which has fallen down directly from the substrate W is received by and drained through the drain duct 581. An inner cover 582 is provided at an inner peripheral side of the drain duct 581.

The substrate W held by the substrate holder 52 is covered by the cover body 6. This cover body 6 includes a ceiling member 61 and a sidewall member 62 extending downwards from the ceiling member 61. When the cover body 6 is placed at a lower position to be described later, the ceiling member 61 is located above the substrate W held by the substrate holder 52, facing the substrate W with a relatively small distance therebetween.

The ceiling member 61 includes a first ceiling plate 611 and a second ceiling plate 612 provided on the first ceiling plate 611. A heater 63 (heating device) is disposed between the first ceiling plate 611 and the second ceiling plate 612. The first ceiling plate 611 and the second ceiling plate 612 are provided as a first sheet-shaped body and a second sheet-shaped body, respectively, which are disposed with the heater 63 therebetween. The first ceiling plate 611 and the second ceiling plate 612 are configured to seal the heater 63 lest the heater 63 should come into contact with the processing liquid such as the plating liquid L1. To be more specific, a seal ring 613 is disposed at an outside of the heater 63 between the first ceiling plate 611 and the second ceiling plate 612, and the heater 63 is sealed by this seal ring 613. Appropriately, the first ceiling plate 611 and the second ceiling plate 612 have corrosion resistance against the processing liquid such as the plating liquid L1, and may be made of, by way of non-limiting example, an aluminium alloy. Further, to improve the corrosion resistance, the first ceiling plate 611, the second ceiling plate 612 and the sidewall member 62 may be coated with Teflon (registered trademark).

The cover body 6 is connected with a cover body moving device 7 via a cover arm 71. The cover body moving device 7 is configured to move the cover body 6 horizontally and vertically. To be more specific, the cover body moving device 7 includes a rotating motor 72 configured to move the cover body 6 horizontally and a cylinder 73 (distance adjuster) configured to move the cover body 6 vertically. The rotating motor 72 is mounted on a supporting plate 74 configured to be movable vertically with respect to the cylinder 73. As an alternative to the cylinder 73, an actuator (not shown) including a motor and a ball screw may be used.

The rotating motor 72 of the cover body moving device 7 is configured to move the cover body 6 between an upper position above the substrate W held by the substrate holder 52 and a retreat position retreated from the upper position. Here, the upper position is a position facing the substrate W held by the substrate holder 52 with a relatively large gap therebetween and overlapped with the substrate W when viewed from above. The retreat position is a position within the chamber 51 which is not overlapped with the substrate W when viewed from above. When the cover body 6 is located at the retreat position, interference between the nozzle arm 56 being moved and the cover body 6 is avoided. A rotational axis of the rotating motor 72 extends vertically, and the cover body 6 is configured to be rotatable horizontally between the upper position and the retreat position.

The cylinder 73 of the cover body moving device 7 is configured to move the cover body 6 up and down to thereby adjust a distance between the first ceiling plate 611 of the ceiling member 61 and the substrate W in which the plating liquid L1 is accumulated on the processing surface Sw. To be more specific, the cylinder 73 locates the cover body 6 at the lower position (a position indicated by a solid line in FIG. 2) or the upper position (a position indicated by a dashed double-dotted line in FIG. 2).

When the cover body 6 is placed at the lower position, the first ceiling plate 611 approaches the substrate W. In order to suppress contamination of the plating liquid L1 or bubble formation within the plating liquid L1, it is desirable to set the lower position lest the first ceiling plate 611 should come into contact with the plating liquid L1 on the substrate W.

The upper position is set to a height position where interference of the cover body 6 with an ambient structure such as the cup 571 or the atmosphere blocking cover 572 can be avoided when the cover body 6 is rotated horizontally.

In the present exemplary embodiment, if the cover body 6 is placed at the aforementioned lower position, the heater 63 is driven to heat the plating liquid L1 on the substrate W.

The sidewall member 62 of the cover body 6 extends downwards from a peripheral portion of the first ceiling plate 611 of the ceiling member 61, and is located at an outside of the substrate W when the plating liquid L1 on the substrate W is heated (that is, the cover body 6 is located at the lower position). If the cover body 6 is placed at the lower position, a lower end of the sidewall member 62 may be located at a position lower than the substrate W.

The heater 63 is provided in the ceiling member 61 of the cover body 6. The heater 63 heats the processing liquid (appropriately, the plating liquid L1) on the substrate W when the cover body 6 is located at the lower position. In the present exemplary embodiment, the heater 63 is disposed between the first ceiling plate 611 and the second ceiling plate 612 of the cover body 6 and hermetically sealed as described above. Thus, a contact between the heater 63 and the processing liquid such as the plating liquid L1 is suppressed.

In the present exemplary embodiment, an inert gas (for example, a nitrogen ($N_2$) gas) is supplied to an inside of the cover body 6 by an inert gas supply 66. The inert gas supply 66 is equipped with a gas nozzle 661 configured to discharge the inert gas to the inside of the cover body 6; and an inert gas source 662 configured to supply the inert gas to the gas nozzle 661. The gas nozzle 661 is provided at the ceiling member 61 of the cover body 6 and is configured to discharge the inert gas toward the substrate W in the state that the cover body 6 covers the substrate W.

The ceiling member 61 and the sidewall member 62 of the cover body 6 are covered by a cover lid 64. This cover lid 64 is disposed on the second ceiling plate 612 of the cover body 6 with supporting members 65 therebetween. That is, the second ceiling plate 612 is provided with the multiple supporting members 65 protruding upwards from a top surface of the second ceiling plate 612, and the cover lid 64 is placed on the supporting members 65. The cover lid 64 is configured to be moved horizontally and vertically along with the cover body 6. Further, it is desirable that the cover lid 64 has insulation property higher than those of the ceiling member 61 and the sidewall member 62 to suppress a leak of heat within the cover body 6 to the vicinity thereof. By way of example, the cover lid 64 is desirably made of a resin material, and, more desirably, the resin material has heat resistance.

A fan filter unit 59 (gas supply) is provided at an upper portion of the chamber 51 to supply clean air (gas) to the vicinity of the cover body 6. The fan filter unit 59 is configured to supply the air into the chamber 51 (particularly, into the atmosphere blocking cover 572), and the supplied air flows toward an exhaust line 81. A downflow of the air flowing downwards is formed around the cover body 6, and a gas vaporized from the processing liquid such as the plating liquid L1 flows toward the exhaust line 81 by being carried by this downflow. Accordingly, a rise of the gas vaporized from the processing liquid and diffusion of this gas into the chamber 51 are suppressed.

The gas supplied from the above-described fan filter unit 59 is exhausted by an exhaust device 8. This exhaust device 8 includes two exhaust pipes 81 provided under the cup 571 and an exhaust duct 82 provided under the drain duct 581. The two exhaust pipes 81 penetrate a bottom of the drain duck 581 and communicate with the exhaust duct 82. The exhaust duct 82 is formed to have a semi-circular ring shape when viewed from the top. In the present exemplary embodiment, the single exhaust duct 82 is provided under the drain duct 581, and the two exhaust pipes 81 communicate with this single drain duct 82.

Heating Unit (First Example)

As stated above, in the plating device 5 according to the present exemplary embodiment, the plating liquid L1 on the processing surface Sw of the substrate W is heated by the heating unit 35 which includes the heater 63 and the ceiling member 61 supporting the heater 63.

Figure 3:
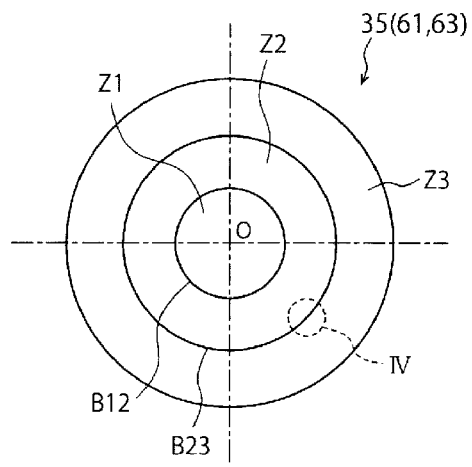
FIG. 3 is a plan view of a heating unit, showing a plurality of heating zones in the heating unit.

FIG. 3 is a plan view of the heating unit 35 and shows a plurality of heating zones Z1 to Z3 in the heating unit 35. The heating unit 35 has a circular plan shape as a whole and has a size substantially equal to or slightly larger than a size of the processing surface Sw of the substrate W in the horizontal direction, thus capable of covering the entire processing surface Sw of the substrate W.

The heating unit 35 according to the present exemplary embodiment is split into the first heating zone Z1 having a circular plan shape; the second heating zone Z2 having an annular plan shape surrounding the first heating zone Z1; and the third heating zone Z3 having an annular plate shape surrounding the second heating zone Z2. Each of the heating zones Z1 to Z3 is provided to heat the processing liquid on the processing surface Sw of the substrate W located directly underneath when the cover body 6 is placed at the lower position (see the position indicted by the solid line in FIG. 2). In this way, the processing surface Sw is split into a plurality of processing zones (not shown), and one of the heating zones of the heating unit 35 is allotted to the corresponding one of the processing zones. The processing liquid is heated in a unit of the processing zones by the corresponding heating zones.

By way of example, the first heating zone Z1 mainly heats the processing liquid on the processing zone having a circular plan shape around a center of the processing surface Sw. Further, the third heating zone Z3 mainly heats the processing liquid on the processing zone having an annular plan shape (particularly, the processing zone including a peripheral portion of the processing surface Sw). The heating zone Z2 mainly heats the processing liquid on the processing zone having an annular plan shape between the processing zone to which the first heating zone Z1 is allotted and the processing zone to which the third heating zone Z3 is allotted.

Furthermore, the plan shapes and the layout of the plurality of heating zones Z1 to Z3 are not limited to the shown examples. By way of example, though the plurality of heating zones Z1 to Z3 are provided to have the same width in a radial direction from a center O in the heating unit 35 shown in FIG. 3, the widths of the heating zones Z1 to Z3 in the radial direction may not necessarily be same. Furthermore, in the shown heating unit 35, though the plurality of heating zones Z1 to Z3 are concentrically arranged, each of the heating zones may have, for example, a rectangular plan shape. Moreover, the notations of the above-described first heating zone Z1, second heating zone Z2 and third heating zone Z3 are merely used to distinguish the heating zones from each other and do not restrict a relationship of the heating zones in terms of the layout thereof. By way of example, the first heating zone Z1 may be distanced farther from the center of the processing surface Sw than the second heating zone Z2 and the third heating zone Z3, and the first to third heating zones Z1 to Z3 may not necessarily arranged in the order of the ordinal numbers. Besides, the plan shapes and the layout of the processing zones on the processing surface Sw correspond to the plan shapes and the layout of the heating zones of the heating unit 35.

Figure 4:
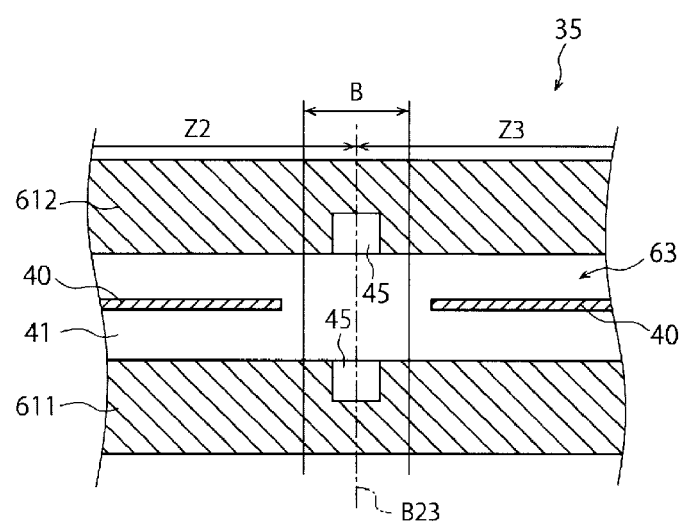
FIG. 4 is a diagram illustrating a cross sectional structure of the heating unit (first example) at a portion marked by a notation 'IV' of FIG. 3.

FIG. 4 is a diagram illustrating a cross sectional structure of the heating unit 35 (first example) at a position indicated by a notation "IV" of FIG. 3. In the following, although the cross sectional structure near a boundary B23 between the second heating zone Z2 and the third heating zone Z3 will be explained as an example, a cross section near a boundary B12 between the first heating zone Z1 and the second heating zone Z2 has the same structure.

The heater 63 includes a multiple number of heating elements 40 provided in the plurality of heating zones Z1 to Z3 of the heating unit 35; and supporting plates 41 configured to support the heating elements 40. The heating elements 40 and the supporting plates 41 are not particularly limited. Typically, the heater 63 may be implemented by a mica heater as a sheet-shaped heating element, and the supporting plate 41 may be made of mica. In the shown heater 63, though the respective heating elements 40 are buried in the supporting plate 41, the way how to dispose the heating elements 40 with respect to the supporting plates 41 is not particularly limited. For example, each heating element 40 may be disposed between a pair of supporting plates 41.

In the heating unit 35 having the above-described configuration, at least one of the first ceiling plate 611 (first sheet-shaped body) and the second ceiling plate 612 (second sheet-shaped body) has a groove 45. This groove 45 is provided at a region corresponding to the boundary between the neighbouring heating zones among the plurality of heating zones Z1 to Z3.

The groove 45 is provided by a space formed at the first ceiling plate 611 and/or the second ceiling plate 612. A specific shape and structure of the groove 45 is not limited to the shown example. The groove 45 may be a space which does not penetrate the first ceiling plate 611 and/or the second ceiling plate 612 (that is, a space defined by a sidewall and a bottom wall), as shown in FIG. 4. Alternatively, the groove 45 may be a space which penetrates the first ceiling plate 611 and/or the second ceiling plate 612 (that is, a space formed by a sidewall), as shown in FIG. 5 to be described later.

In the heating unit 35 shown in FIG. 4, each of the first ceiling plate 611 and the second ceiling plate 612 has the single groove 45 between the neighbouring heating zones. A height-directional cross sectional area of a portion of the first ceiling plate 611 (second ceiling plate 612) where the groove 45 is provided is smaller than a height-directional cross sectional area of a portion thereof where no groove 45 is provided. The groove 45 having this structure serves as a resistor against heat transfer and suppresses heat conduction between the neighbouring heating zones. That is, an amount of the heat conduction at the portion of the first ceiling plate 611 (second ceiling plate 612) where the groove 45 is provided is reduced as compared to an amount of the heat conduction at the portion of the first ceiling plate 611 (second ceiling plate 612) where the groove 45 is not provided. In this way, by suppressing the heat conduction between the neighbouring heating zones (between the second heating zone Z2 and the third heating zone Z3 in FIG. 4), a heating control in the unit of the heating zones can be performed accurately. Therefore, the heating control over the plating liquid L1 on the processing surface Sw of the substrate W can be carried out accurately in the unit of the processing zones.

Heating Unit (Second Example)

Figure 5:
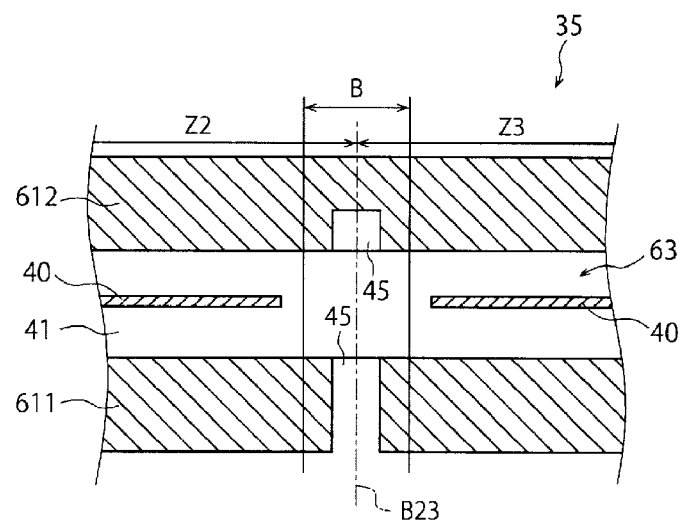
FIG. 5 is a diagram illustrating a cross sectional structure of the heating unit (second example).

FIG. 5 is a diagram illustrating a cross sectional structure of the heating unit 35 (second example). In this example, parts which are the same as or similar to those of the heating unit 35 (see FIG. 4) of the above-described first example will be assigned same reference numerals, and detailed description thereof will be omitted.

In the heating unit 35 of the second example, a groove 45 provided at the first ceiling plate 611 (first sheet-shaped body) is formed through the first ceiling plate 611. The other structure of the heating unit 35 shown in FIG. 5 is the same as that of the heating unit 35 shown in FIG. 4.

Since the groove 45 of the first ceiling plate 611 is formed completely through the first ceiling plate 611, the first ceiling plate 611 can be completely split between the heating zones. Accordingly, the heat conduction through the first ceiling plate 611 is blocked by the groove 45, so that the heat transfer between the neighbouring heating zones can be suppressed effectively. Thus, a large temperature difference can be easily set between the neighbouring heating zones, and the heating control over the processing liquid on the processing surface Sw of the substrate W can be performed with high accuracy in the unit of the processing zones. Further, even if the large temperature difference is set between the heating zones, a thermal stress that might be applied to the first ceiling plate 611 can be effectively reduced by the groove 45 which is formed as a through hole, so that distortion of the heating unit 35 due to the thermal stress can be suppressed.

Like the groove 45 of the second ceiling plate 612 shown in FIG. 4, a groove 45 of the second ceiling plate 612 shown in FIG. 5 is opened toward the heater 63 side, and a side thereof opposite from the heater 63 is closed by the second ceiling plate 612. Alternatively, this groove 45 of the second ceiling plate 612 may be formed as a through hole, the same as the groove 45 of the first ceiling plate 611. By way of example, both the groove 45 of the first ceiling plate 611 and the groove 45 of the second ceiling plate 612 may be formed as the through holes. As another example, the groove 45 of the first ceiling plate 611 may not be formed as the through hole, whereas the groove 45 of the second ceiling plate 612 may be formed as the through hole.

Here, however, from the viewpoint of obtaining a strength of the heating unit 35, it is desirable that the second ceiling plate 612 is not completely split by the groove 45. As compared to the first ceiling plate 611, the second ceiling plate 612 contributes less to the heating of the processing liquid on the processing surface Sw. To carry out the heating control over the processing liquid on the processing surface Sw successively while securing the strength of the heating unit 35, it is desirable that the groove 45 of the first ceiling plate 611 is formed as the through hole while the groove 45 of the second ceiling plate 612 is not formed as the through hole.

The present inventors have repeatedly conducted simulations to investigate a temperature difference that can be set between the heating zones by changing the shape and the layout of the groove(s) 45 provided at the first ceiling plate 611 and/or the second ceiling plate 612. As a result, it is found out that the temperature difference equal to or larger than 10° C. may be set between the neighboring heating zones by forming the groove 45 as the through hole, whereas only the temperature difference of 1° C. to 2° C. is generated between the neighboring heating zones when the groove 45 is not the through hole. Particularly, it is also found out that the temperature difference equal to or larger than 30° C. may be generated between the neighboring heating zones by using a resin thermal insulator for the second ceiling plate 612 and forming the groove 45 of the first ceiling plate 611 as the through hole. As stated above, forming the groove 45 of the first ceiling plate 611 and/or the second ceiling plate 612 as the through hole(s) is very effective in applying the large temperature difference between the neighboring heating zones.

Heating Unit (Another Example)

Further, the shapes of the grooves 45 provided at the first ceiling plate 611 and/or the second ceiling plate 612 may not be limited to the examples shown in FIG. 4 and FIG. 5. For example, though each groove 45 shown in FIG. 4 is opened in a direction toward the heater 63, each groove 45 may be opened in a direction distancing away from the heater 63. Further, either (for example, the first ceiling plate 611) of the first ceiling plate 611 and the second ceiling plate 612 may have a groove 45 opened in the direction distancing away from the heater 63, and the other (for example, the second ceiling plate 612) may have a groove 45 opened in the direction toward the heater 63. Moreover, at least one of the first ceiling plate 611 and the second ceiling plate 612 may have both the groove 45 opened in the direction distancing away from the heater 63 and the groove 45 opened in the direction toward the heater 63. In addition, the shape of the groove 45 may be varied depending on a place where the groove 45 is formed. By way of example, the shape of the groove 45 formed at the region corresponding to the boundary B12 between the first heating zone Z1 and the second heating zone Z2 and the shape of the groove 45 formed at the region corresponding to the boundary B23 between the second heating zone Z2 and the third heating zone Z3 may be different.

Between the heater 63 and the processing surface Sw, the first ceiling plate 611 is placed at a position where it is closer to the processing surface Sw than the second ceiling plate 612 is. Thus, from the viewpoint of controlling the heating of the plating liquid L1 on the processing surface Sw accurately in the unit of the processing zones, it is desirable to provide the groove 45 at the first ceiling plate 611 at least, between the first ceiling plate 611 and the second ceiling plate 612. Further, from the viewpoint of transferring heat from the heating elements 40 to the plating liquid L1 on the processing surface Sw efficiently, it is desirable to form, at the first ceiling plate 611, the groove 45 opened in the direction distancing away from the heater 63, and to increase a surface area of a bottom surface of the first ceiling plate 611 to thereby enlarge a heat radiation area.

Furthermore, though each of the first ceiling plate 611 and the second ceiling plate 612 shown in FIG. 4 and FIG. 5 has only one groove 45 at the region corresponding to the boundary between the neighbouring heating zones, they may have more than one groove 45 at the corresponding region. Here, the term "region corresponding to the boundary between the neighbouring heating zones" refers to a region near the boundary between the neighbouring heating zones and a region between the neighbouring heating zones where the heating elements 40 are not provided. In FIG. 4, the "region corresponding to the boundary between the neighbouring heating zones" is indicated by a notation "B," and an end(s) of one or both of the neighbouring heating zones may be included in the "region corresponding to the boundary between the neighbouring heating zones."

In addition, the material forming the second ceiling plate 612 may be different from a material forming the first ceiling plate 611. For instance, the first ceiling plate 611 may be formed of a material (for example, aluminium alloy) having high heat transfer performance (particularly, heat conduction performance and heat radiation performance), and the second ceiling plate 612 may be formed of a material (for example, a resin) having the heat transfer performance lower than that of the material forming the first ceiling plate 611. Radiation heat from the first ceiling plate 611 is directly transferred to the processing liquid on the processing surface Sw of the substrate W. Accordingly, by forming the first ceiling plate 611 using the material having the high heat transfer performance, the processing liquid on the processing surface Sw of the substrate W can be heated efficiently. Meanwhile, since the heater 63 and the first ceiling plate 611 exist between the second ceiling plate 612 and the substrate W, heat of the second ceiling plate 612 is not directly transferred to the processing liquid on the processing surface Sw, basically. Further, since the heat of the second ceiling plate 612 is transferred between the heating zones of the heating unit 35 through the second ceiling plate 612, it may impede application of the larger temperature difference between the heating zones. In view of this, by forming the second ceiling plate 612 using the material having the low heat transfer performance, the application of a required temperature difference between the heating zones of the heating unit 35 can be easily achieved.

Figure 6:
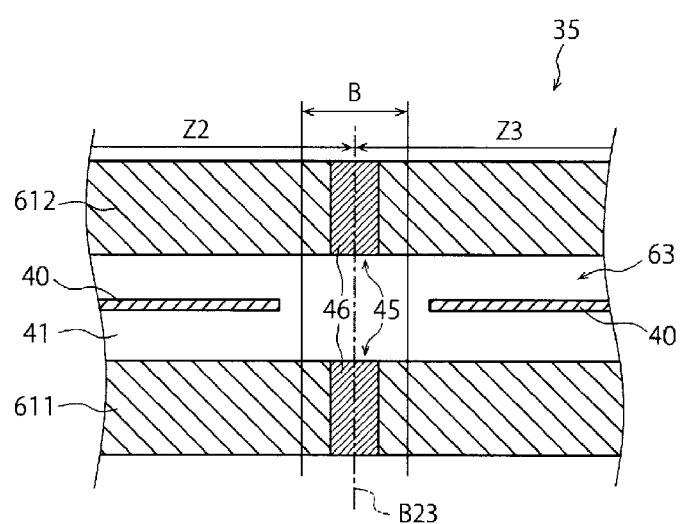
FIG. 6 is a diagram illustrating a cross sectional structure of one modification example of the heating unit.

Furthermore, a filling member 46 may be disposed in the groove 45, as depicted in FIG. 6. From the point of view of applying the large temperature difference between the heating zones, it is desirable that the filling member 46 is made of a material (for example, a resin or another heat insulating material) having the heat transfer performance (particularly, heat conduction performance) lower than that of the material forming the first ceiling plate 611 and the second ceiling plate 612. Further, when the groove 45 of the first ceiling plate 611 is the through hole, it is desirable that the filling member 46 is disposed in the groove 45 provided at this first ceiling plate 611 to suppress a particle from falling down on the processing surface Sw through the groove 45 during the processing of the substrate W. In the heating unit 35 shown in FIG. 6, both the groove 45 of the first ceiling plate 611 and the groove 45 of the second ceiling plate 612 are the through holes, and each of these grooves 45 is entirely filled with the filling member 46 which is made of the heat insulating material. In this case, the heat transfer between the heating zones can be suppressed while securing the strength of the heating unit 35, so that it is possible to apply the large temperature difference between the heating zones. Further, the entire groove 45 may not necessarily be filled with the filling member 46, and the filling member 46 may be disposed only in a part of the groove 45. Furthermore, the filling member 46 may also be disposed in the groove 45 (see FIG. 4) which is not the through hole.

Furthermore, a distance between the first ceiling plate 611 and the processing surface Sw of the substrate W may be set to be different between at least two of the plurality of heating zones of the heating unit 35. That is, the first ceiling plate 611 in a certain heating zone may be protruded toward the processing surface Sw of the substrate W (that is, a lower side of FIG. 7) as compared to the first ceiling plate 611 in other one or more heating zones. In this case, a surface of the first ceiling plate 611 near the processing surface Sw in the certain heating zone can be positioned closer to the processing surface Sw than a surface of the first ceiling plate 611 near the processing surface Sw in the other one or more heating zones. If the first ceiling plate 611 is closer to the processing surface Sw, the processing liquid on the processing surface Sw can be heated efficiently. Thus, by varying the distance between the first ceiling plate 611 and the processing surface Sw of the substrate W among the heating zones, heating efficiency for the processing liquid can be adjusted for the respective heating zones.

Figure 7:
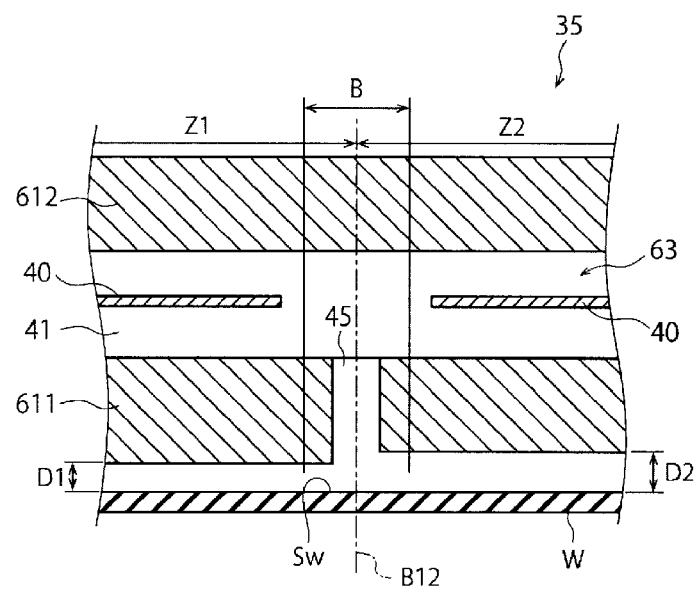
FIG. 7 is a diagram illustrating a cross sectional structure of another modification example of the heating unit.

In FIG. 7, a distance (referred to as "first heating distance") D1 between the first ceiling plate 611 and the processing surface Sw in the first heating zone Z1 is smaller than a distance (referred to as "second heating distance") D2 between the first ceiling plate 611 and the processing surface Sw in the second heating zone Z2 (D1<D2). Accordingly, a temperature of the processing liquid in the processing zone corresponding to the first heating zone Z1 may be increased by the heating unit 35 more easily than a temperature of the processing liquid in the processing zone corresponding to the second heating zone Z2. Though not shown in FIG. 7, a distance (referred to as "third heating distance") D3 between the first ceiling plate 611 and the processing surface Sw in the third heating zone Z3 may be set to be different from the first heating distance D1 and/or the second heating distance D2. Further, a specific relationship between the first heating distance D1, the second heating distance D2 and the third heating distance D3 is not particularly limited. By way of example, a relationship of "D3<D2" or "D1=D3" may be satisfied. From the viewpoint of uniforming the temperature of the processing liquid on the processing surface Sw, it is desirable that the heating distance (for example, the first heating distance D1 and/or the third heating distance D3) in the heating zone corresponding to the processing zone in which the temperature of the processing liquid is difficult to increase is set to be smaller than the heating distance (for example, the second heating distance D2) of the other heating zones.

Besides, the control over the heating unit 35 (particularly, the heating elements 40) is performed by the controller 3 (see FIG. 1). By way of example, in case that a heating amount of the plating liquid L1 at the peripheral portion of the processing surface Sw of the substrate W is set to be larger than a heating amount of the plating liquid L1 at the central portion of the processing surface Sw, a caloric power of the heating element 40 disposed in the third heating zone Z3 is larger than a caloric power of the heating element 40 disposed in the first heating zone Z1. To carry out this heating control appropriately, a temperature detection sensor (not shown) such as an infrared ray sensor configured to measure the temperature of the plating liquid L1 on the processing surface Sw for each processing zone may be provided. In such a case, the controller 3 may control the caloric power of each heating element (for example, a power fed to each heating element 40) based on a detection result of the temperature detection sensor.

Figure 8:
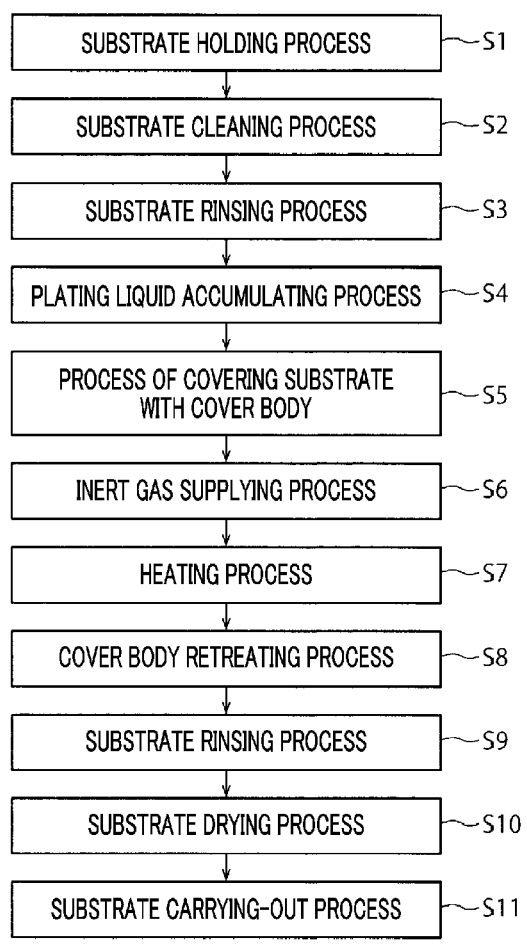
FIG. 8 is a flowchart illustrating a plating processing on a substrate in the plating apparatus of FIG. 1.

Now, an operation of the present exemplary embodiment having the above-described configuration will be explained with reference to FIG. 8. Here, a plating method using the plating apparatus 1 will be described as an example of a substrate liquid processing method.

The plating method performed by the plating apparatus 1 includes a plating processing upon the substrate W. The plating processing is performed by the plating device 5. An operation of the plating device 5 to be described below is controlled by the controller 3. Further, while the following processing is being performed, the clean air is supplied into the chamber 51 from the fan filter unit 59 and flows toward the exhaust pipes 81.

First, the substrate W is carried into the plating device 5 to be held by the substrate holder 52 horizontally (process S1).

Then, the substrate W horizontally held by the substrate holder 52 is subjected to a cleaning processing (process S2). In this cleaning processing, the rotation motor 523 is first driven to rotate the substrate W at a predetermined rotation number. Subsequently, the nozzle arm 56 placed at the retreat position is moved to the discharge position. Then, the cleaning liquid L2 is supplied onto the substrate W being rotated from the cleaning liquid nozzle 541, so that the surface of the substrate W is cleaned. Accordingly, a deposit adhering to the substrate W is removed from the substrate W. The cleaning liquid L2 supplied onto the substrate W is drained into the drain duct 581.

Subsequently, the substrate W is subjected to a rinsing processing (process S3). In this resining processing, the rinse liquid L3 is supplied from the rinse liquid nozzle 551 onto the substrate W being rotated, so that the surface of the substrate W is rinsed. Accordingly, the cleaning liquid L2 remaining on the substrate W is washed away. The rinse liquid L3 supplied onto the substrate W is drained into the drain duct 581.

Thereafter, a plating liquid accumulating process of forming a puddle of the plating liquid L1 on the processing surface Sw of the substrate W is performed (process S4). First, the rotation number of the substrate W is reduced to be smaller than the rotation number in the rinsing processing. By way of example, the rotation number of the substrate W may be set to be in a range from 50 rpm to 150 rpm. Accordingly, a plating film formed on the substrate W can be uniformed. Further, the rotation of the substrate W may be stopped to increase an accumulation amount of the plating liquid L1. Then, the plating liquid L1 is supplied onto the top surface (that is, the processing surface Sw) of the substrate W from the plating liquid nozzle 531. The discharged plating liquid L1 stays on the processing surface Sw due to a surface tension, so that a layer (a so-called puddle) of the plating liquid L1 is formed. A part of the plating liquid L1 flows out from the processing surface Sw to be drained through the drain duct 581. After a preset amount of the plating liquid L1 is discharged from the plating liquid nozzle 531, the discharge of the plating liquid L1 is stopped. Then, the nozzle arm 56 is located to the retreat position.

Next, as a plating liquid heating process, the plating liquid L1 accumulated on the substrate W is heated. This plating liquid heating process includes a process of covering the substrate W with the cover body 6 (process S5), a process of supplying the inert gas (process S6), a process of moving the cover body 6 to the lowered position and heating the plating liquid L1 (process S7) and a process of retreating the cover body 6 from above the substrate W (process S8). Further, it is desirable that the rotation number of the substrate W in this plating liquid heating process is maintained equal to the rotation number in the plating liquid accumulating process (or the rotation of the substrate W is stopped).

In the process of covering the substrate W with the cover body 6 (process S5), the turning motor 72 of the cover body moving device 7 is first driven, so that the cover body 6 located at the retreat position is rotated horizontally and placed at the upper position. Then, the cylinder 73 of the cover body moving device 7 is driven, so that the cover body 6 placed at the upper position is moved down to the lowered position. Accordingly, the substrate W is covered by the cover body 6, so that the space around the substrate W is closed.

After the substrate W is covered by the cover body 6, the inert gas is discharged to the inside of the cover body 6 from the gas nozzle 661 provided at the ceiling member 61 of the cover body 6 (process S6). Accordingly, air inside the cover body 6 is replaced by the inert gas, so that the space around the substrate W is turned into a low-oxygen atmosphere. The inert gas is discharged for a predetermined time, and upon the lapse of this predetermined time, the discharge of the inert gas is stopped.

Thereafter, the plating liquid L1 accumulated on the substrate W is heated (process S7). If the temperature of the plating liquid L1 is raised up to a temperature where a component of the plating liquid L1 is precipitated, the component of the plating liquid L1 is precipitated on the top surface of the substrate W, so that the plating film is formed and grows. In this heating process, the plating liquid L1 is heated to be maintained at the temperature where the precipitation takes place for a time period required to obtain the plating film having a required film thickness.

Upon the completion of the heating process, the cover body moving device 7 is driven to move the cover body 6 to the retreat position (process S8). Through these operations, the plating liquid heating process (the processes S5 to S8) on the substrate W is completed.

Subsequently, the substrate W is subjected to a rinsing processing (process S9). In this rinsing processing, the rotation number of the substrate W is increased to be higher than the rotation number in the plating processing. By way of example, the substrate W is rotated at the same rotation number as in the substrate rinsing process (process S3) before the plating processing. Then, the rinse liquid nozzle 551 placed at the retreat position is moved to the discharge position. Thereafter, the rinse liquid L3 is supplied from the rinse liquid nozzle 551 onto the substrate W being rotated, so that the surface of the substrate W is cleaned, and the plating liquid L1 remaining on the substrate W is washed away.

Afterwards, the substrate W is subjected to a drying processing (process S10). In this drying processing, the rotation number of the substrate W is increased to be higher than the rotation number in, for example, the substrate rinsing process (process S9) to rotate the substrate W at a high speed. Accordingly, the rinse liquid L3 remaining on the substrate W is removed by being scattered, and the substrate W having the plating film formed thereon is obtained. In this case, the drying of the substrate W may be accelerated by discharging an inert gas such as a nitrogen ($N_2$) gas onto the substrate W.

Thereafter, the substrate W is separated from the substrate holder 52 and carried out from the plating device 5 (process S11).

In the above-described series of processes, particularly, when the plating liquid L1 on the processing surface Sw of the substrate W is heated (process S7), a power feed to the heating elements 40 in the individual heating zones of the heater 63 divided by the grooves 45 is controlled by the controller 3, and the heating control over the plating liquid L1 on the processing surface Sw is performed in the unit of the processing zones.

In the present exemplary embodiment as described above, by providing the groove 45 in the region corresponding to the boundary between the neighbouring heating zones of the heater 63, the heating control over the plating liquid L1 on the substrate W can be performed in the unit of the processing zones with high accuracy. Especially, by providing the groove 45 at the first ceiling plate 611 disposed between the heater 63 and the substrate W (particularly, the processing surface Sw), the heat amount generated from the heater 63 toward the substrate W can be changed for each heating zone effectively.

Further, by configuring the groove 45 to be opened in the direction toward the heater 63, the surface area of the portion of the first ceiling plate 611 and/or the second ceiling plate 612 facing the heater 63 can be increased, so that the radiation of the heat generated from the heater 63 can be carried out efficiently. Furthermore, an exposed surface (that is, lower surface) of the first ceiling plate 611 and an exposed surface (that is, an upper surface) of the second ceiling plate 612 can be formed flat. Meanwhile, by configuring the groove 45 to be opened in the direction distancing away from the heater 63, the surface area exposed to the outside can be increased, so that the heat generated from the heater 63 (particularly, the individual heating elements 40) can be transferred to the outside efficiently.

Moreover, by providing the plurality of grooves 45 between the heating zones, the heat conduction between the heating zones can be suppressed more efficiently, and the surface area can be further increased.

Besides, the formation of the grooves 45 at the first ceiling plate 611 and/or the second ceiling plate 612 can be achieved in a relatively simple manner. Therefore, the heating unit 35 can be prepared simply. Furthermore, since a general-purpose device such as the mica heater can be used as the heater 63, a cost of the heating unit 35 can be reduced.

The various exemplary embodiments and modification examples are not limiting and can be modified in various ways without departing from the technical conception and essence of the present disclosure. Further, the constituent components described in the above exemplary embodiments and modification examples may be combined appropriately to produce various other embodiments. Some of the constituent components described in the various exemplary embodiments and modification examples may be deleted in various ways. Further, the constituent components in the different exemplary embodiments and modification examples may be appropriately combined.

By way of example, the substrate liquid processing apparatus and the substrate liquid processing method according to the present disclosure still has advantages when they are applied to a liquid processing other than the plating processing and when a processing liquid other than the plating liquid L1 is used. Further, the present disclosure may be embodied by a recording medium (for example, the recording medium 31 of the controller 3) which stores therein a program for allowing, when executed by a computer for controlling operations of the substrate liquid processing apparatus (plating apparatus 1), the computer to control the substrate liquid processing apparatus to thereby implement the above-described substrate liquid processing method.

According to the exemplary embodiment, it is possible to carry out a heating control over a processing liquid on a substrate with high accuracy in the unit of processing zones.

We claim:

1. A substrate liquid processing apparatus configured to perform a liquid processing on a processing surface of a substrate with a processing liquid, the substrate liquid processing apparatus comprising:
    a substrate holder configured to hold the substrate;
    a processing liquid supply configured to supply the processing liquid onto the processing surface of the substrate held by the substrate holder; and a heating unit configured to heat the processing liquid on the processing surface, wherein the heating unit comprises a heater, and a first sheet-shaped body and a second sheet-shaped body which are disposed to face the heater therebetween, the first sheet-shaped body is disposed between the heater and the processing surface, the heater comprises multiple heating elements provided in multiple heating zones of the heating unit, and at least one of the first sheet-shaped body or the second sheet-shaped body has a groove thereon, and the groove, formed on the at least one of the first sheet-shaped body or the second sheet-shaped body, is provided at a region corresponding to a boundary between neighboring heating zones among the multiple heating zones.

2. The substrate liquid processing apparatus of claim 1, wherein the groove is provided at the first sheet-shaped body.

3. The substrate liquid processing apparatus of claim 2, wherein the groove provided at the first sheet-shaped body is formed completely through the first sheet-shaped body.

4. The substrate liquid processing apparatus of claim 3, further comprising:

a filling member disposed in the groove provided at the first sheet-shaped body.

5. The substrate liquid processing apparatus of claim 1, wherein the groove is opened in a direction toward the heater.

6. The substrate liquid processing apparatus of claim 1, wherein the groove is opened in a direction distanced away from the heater.

7. The substrate liquid processing apparatus of claim 1, wherein the groove includes multiple grooves, and the multiple grooves are provided at the region corresponding to the boundary between the neighboring heating zones.

8. The substrate liquid processing apparatus of claim 1, wherein the heater comprises a supporting plate configured to support the multiple heating elements, and the supporting plate is formed of mica.

9. The substrate liquid processing apparatus of claim 1, wherein a distance between the first sheet-shaped body and the processing surface is set to be different between at least two heating zones among the multiple heating zones.

* * * * *